United States Patent
Katayama et al.

(10) Patent No.: US 6,191,967 B1
(45) Date of Patent: Feb. 20, 2001

(54) VOLTAGE SUPPLY DEVICE HAVING SELF-TESTING CIRCUIT

(75) Inventors: Osamu Katayama, Nagoya; Takahiro Iwamura, Kariya; Tetsuo Hirano, Anjo, all of (JP)

(73) Assignee: Denso Corporation, Kariya (JP)

( * ) Notice: Under 35 U.S.C. 154(b), the term of this patent shall be extended for 0 days.

(21) Appl. No.: 09/314,880

(22) Filed: May 19, 1999

(30) Foreign Application Priority Data

May 20, 1998 (JP) .................................................. 10-138323

(51) Int. Cl.$^7$ ............................. H02M 7/538; G05F 3/08
(52) U.S. Cl. ............................ 363/134; 327/540; 323/311
(58) Field of Search .............................. 363/134, 16, 17, 363/132, 97, 41, 58; 327/112, 540; 323/311, 312

(56) References Cited

U.S. PATENT DOCUMENTS

| 4,782,290 | * | 11/1988 | Sakai et al. | 324/765 |
| 5,023,476 | * | 6/1991 | Watanabe et al. | 323/311 |
| 5,870,296 | * | 2/1999 | Schaffer | 363/65 |

FOREIGN PATENT DOCUMENTS

| 5-119339 | 5/1993 | (JP) . |
| 8-137433 | 5/1996 | (JP) . |
| 9-74345 | 3/1997 | (JP) . |

* cited by examiner

*Primary Examiner*—Peter S. Wong
*Assistant Examiner*—Rajnikant B. Patel
(74) *Attorney, Agent, or Firm*—Pillsbury Madison & Sutro LLP

(57) ABSTRACT

A device selectively supplying a high voltage and a ground level voltage to electrodes of an electroluminescent display panel. The voltage supply device includes a first and a second transistor connected in series, and outputs the high voltage upon turning on the first switching transistor and the ground level voltage upon turning on the second switching transistor. The device includes a circuit for selecting either an operation mode under which the device is normally operated with the high voltage or a test mode under which the device is tested under a low test voltage. The mode selection is performed by an external signal supplied to the device. Under the test mode, the switching transistors are turned on with a low gate voltage by operation of a circuit built in the device. Accordingly, the voltage supply device normally operated under the high voltage is easily tested under the low test voltage.

8 Claims, 3 Drawing Sheets

| | | | | | OPERATION MODE | | TEST MODE | |
|---|---|---|---|---|---|---|---|---|
| Sp | L | L | L | L | H | H | H | H |
| Sm | L | L | H | H | L | L | H | H |
| Sc | L | H | L | H | L | H | L | H |
| FET 20 | off | off | off | off | off | on | off | on |
| FET 21 | off | off | off | off | on | off | on | off |
| FET 23 | off | off | off | off | off | on | off | off |
| FET 26 | off | off | off | off | off | off | off | on |

VOLTAGE SUPPLY DEVICE HAVING SELF-TESTING CIRCUIT

CROSS-REFERENCE TO RELATED APPLICATION

This application is based upon and claims benefit of priority of Japanese Patent Application No. Hei-10-138323 filed on May 20, 1998, the content of which is incorporated herein by reference.

BACKGROUND OF THE INVENTION

1. Field of the Invention

The present invention relates to a voltage supply device which drives a relatively high voltage load such as an electroluminescent display panel, and more particularly to such a device that includes a circuit for testing its own operation under a test voltage that is considerably lower than a normal operation voltage.

2. Description of Related Art

An example of a voltage supply device for driving scanning and data electrodes of an electroluminescent display panel is disclosed in JP-A-8-137433. In this device, an output circuit for selectively outputting a high voltage and a ground voltage, essence of which is shown in FIG. 4, is used. An output circuit 3 composed of a P-channel MOSFET 1 and an N-channel MOSFET 2, both connected in series, is connected between a plus terminal +V and a ground terminal GND of a high voltage source. Both MOSFETs 1 and 2 constitute a push-pull circuit, and an output terminal 4 is connected to a junction of both MOSFETs. A gate voltage switching circuit 5 composed of plural resistances 6 and an N-channel MOSFET 7, all connected in series, is connected in parallel to the output circuit 3. A divider terminal 6a of the switching circuit 5 is connected to a gate of the MOSFET 1. An input terminal 8 is connected to a gate of the MOSFET 7, and another input terminal 9 is connected to a gate of the MOSFET 2.

The MOSFET 7 is turned on when a signal is fed from the input terminal 8, thereby bringing a voltage at the divider terminal 6a to a level that turns on the MOSFET 1 and is a little lower than the plus terminal voltage +V. When the MOSFET 1 is turned on, the voltage at the output terminal 4 becomes the plus terminal voltage +V. The MOSFET 2 is turned on when a signal is fed from the input terminal 9, thereby bringing the output voltage at the output terminal 4 to the ground level GND. The input signals fed from the input terminals 8 and 9 are relatively low, e.g., 5 V that is the same as an operating voltage of a control circuit. Thus, the output voltage of the output terminal 4 is selectively switched between +V and GND, and is supplied to electrodes of an electroluminescent display panel.

Usually, operation of the driver IC including the output circuit 3, i.e., whether the output from the output terminal 4 is selectively switched between +V and GND according to the input signals fed from the input terminals 8 and 9, is tested after completion of the driver IC. To test the operation of the conventional driver IC, it is necessary to supply a power source voltage that is as high as 150 V, for example. Therefore, the test is not easy, and a testing apparatus having a high voltage is required.

SUMMARY OF THE INVENTION

The present invention has been made in view of the above-mentioned problem, and an object of the present invention is to provide an improved power supply device in which an operation test can be performed under a low voltage even if the power supply device itself outputs a high voltage. Another object of the present invention is to provide a method of testing such a device under a low voltage.

An output circuit, connected to a high voltage terminal and a ground terminal of a power source having a relatively high voltage, e.g., 150 V, selectively outputs the high voltage and the ground voltage under a normal operation. The output circuit includes a first switching transistor and a second switching transistor, both connected in series, and outputs the high voltage when the first transistor is turned on and the ground voltage when the second transistor is turned on. Both switching transistors are turned on or off by controlling the gate voltage thereof.

Operation of the voltage supply device is switched between a normal operation mode in which the device is operated under a high voltage, e.g., 150 V and a test mode in which the device is tested under a low voltage, e.g., 5 V, the same voltage as a control circuit voltage. The operation and test modes are switched based on an external signal fed to the device. Under the operation mode, the first switching transistor is turned on with a high gate voltage that is a little lower than the terminal voltage (only clearing a threshold voltage of the first switching transistor), and the second switching transistor is turned on with a low gate voltage, e.g., 5 V. Under the test mode, the first switching transistor is turned on with a low gate voltage, e.g., the ground voltage, and the second switching transistor is turned on with the same low gate voltage as under the operation mode. Those gate voltages are switched by a gate voltage switching circuit built in the voltage supply device according to the external signals indicating either the operation mode or the test mode.

An additional external signal for prohibiting both of the first and second switching transistors from being tuned on may be provided in the device to suppress unnecessary power consumption. A plurality of the output circuits each including its own controlling circuit may be integrated into a single chip that constitutes a voltage supply device as a whole.

According to the present invention, the voltage supply device normally operated under a high voltage can be tested under a low voltage, using its own built-in circuits. Therefore, the device is easily tested without supplying a high voltage thereto.

Other objects and features of the present invention will become more readily apparent from a better understanding of the preferred embodiment described below with reference to the following drawings.

DETAILED DESCRIPTION OF THE PREFERRED EMBODIMENT

Figure 2:
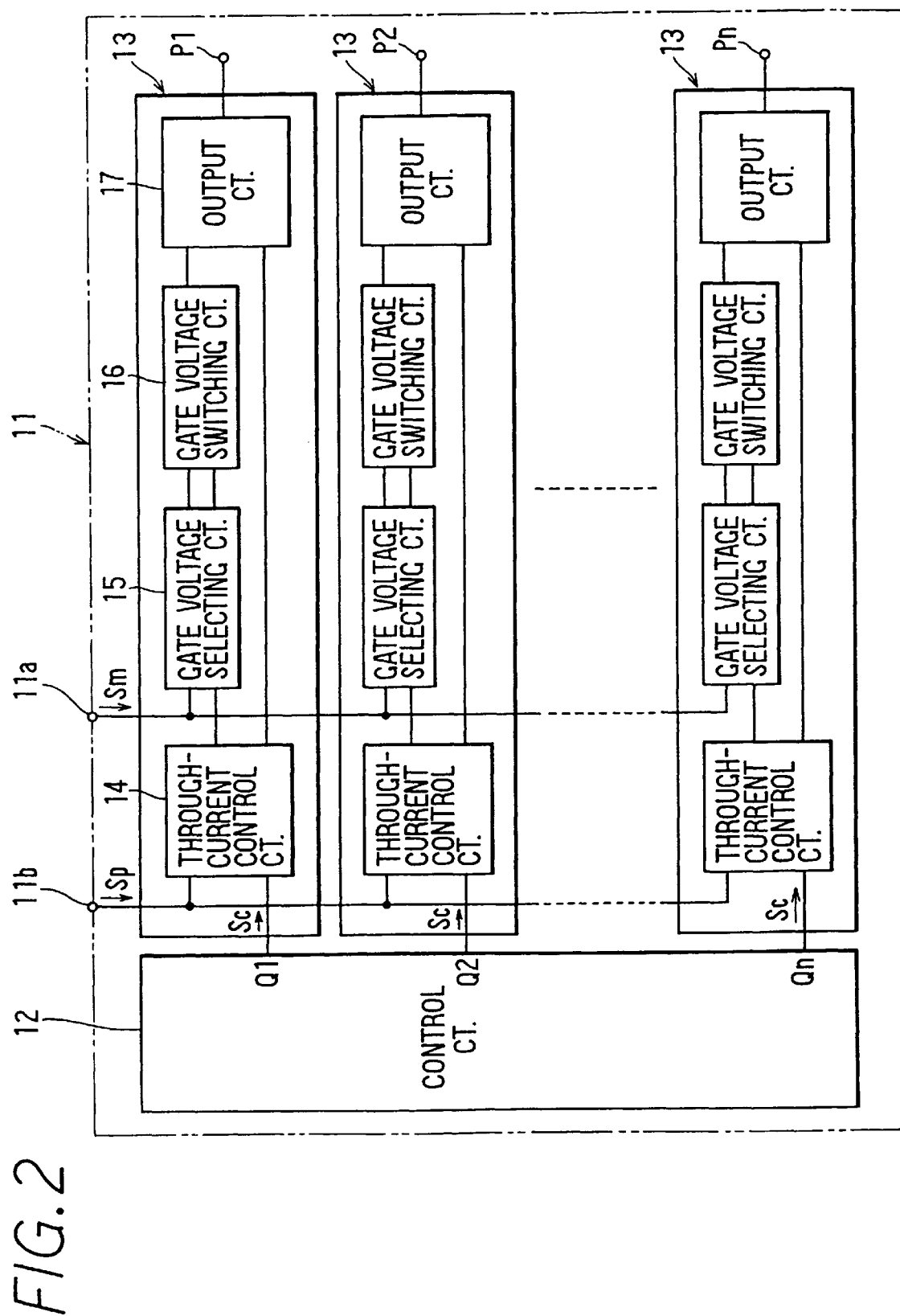
FIG. 2 is a block showing a whole structure of the voltage supply device.
Figures 3, 4:
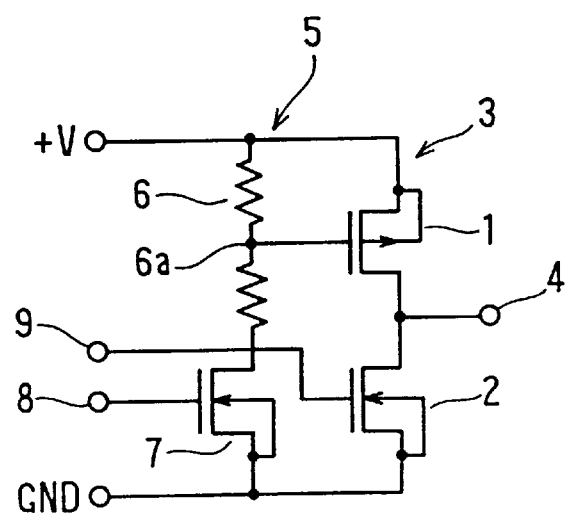
FIG. 3 is a table showing switching operation of FETs used in the power supply device, together with levels of signals fed to the voltage supply device.
FIG. 4 is a circuit diagram showing part of a conventional voltage supply device.

A preferred embodiment of the present invention will be described with reference to FIGS. 1–3. A whole structure of a voltage supply device 11 in which all the components are integrated into one chip integrated circuit (IC) is shown in FIG. 2 as a block diagram. The voltage supply device 11 includes plural drivers 13 and a control circuit 12. The control circuit 12 is of a known type and includes shift registers (not shown) for controlling outputs from output terminals Q1 - Qn, each corresponding to each driver 13. An operation signal Sc is fed from each output terminal Q1 - Qn to each driver 13. The operation signal Sc is a bi-level signal, having a high level signal (H) and a low level signal (L). The signal level of the output terminals Q1 - Qn becomes H sequentially one by one, and the signal level of all other terminals becomes L. When any one of the output terminals Q1 - Qn is H, a high voltage is delivered from a corresponding output terminal P1 - Pn of the driver 13. When the signal level of a terminal Q1 - Qn is L, a ground level voltage is delivered from a corresponding terminal P1 - Pn. Thus, electrodes of an electroluminescent panel connected to the output terminals P1 - Pn are sequentially scanned.

Each driver 13 has a same structure composed of: a through-current control circuit 14 to which the operation signal Sc is fed; a gate voltage selecting circuit 15; a gate voltage switching circuit 16; and an output circuit 17. Those circuits are connected in this order. A terminal 11a for feeding a mode selecting signal Sm and a terminal 11b for feeding a through-current control signal Sp are connected to the driver 13 as external terminals. The signals Sm and Sp are bi-level signals each having H and L levels.

Figure 1:
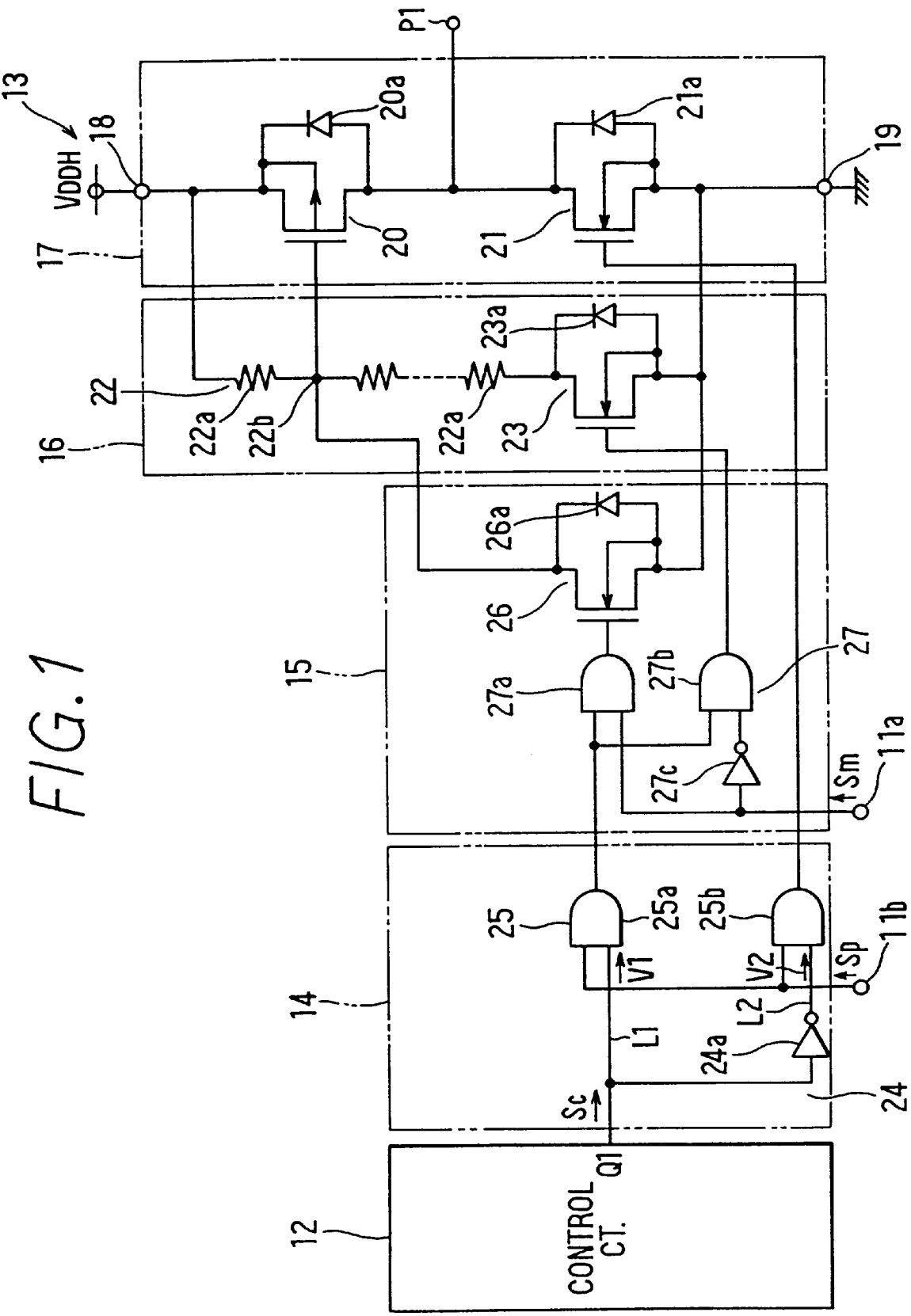
FIG. 1 is a circuit diagram showing part of a voltage supply device according to the present invention.

A detailed circuit diagram of the driver 13 having an output terminal P1 is shown in FIG. 1 as a representative of all other drivers 13. The output circuit 17 that includes a P-channel MOSFET 20 and an N-channel MOSFET 21, each having a structure complementary to each other and connected in series, is connected between a plus terminal 18 having a voltage $V_{DDH}$ and a ground terminal 19 of a power source. The output terminal P1 is connected to a junction of both MOSFETs 20, 21, forming a push-pull circuit. The power source voltage $V_{DDH}$ is high, for example, 125 V–210 V. The MOSFETs 20, 21 have to be suitable to such a high voltage, and therefore they have a structure of a lateral double-diffused MOS (LDMOS).

The gate voltage switching circuit 16 composed of a divider circuit 22 having plural dispersed resistances 22a and an N-channel MOSFET 23 having an LDMOS structure, all connected in series, is connected in parallel to the output circuit 17. When the MOSFET 23 is turned on, a divided voltage Vd appears at a divider terminal 22b in the divider circuit 22. The divided voltage Vd that is a little lower than the plus terminal voltage $V_{DDH}$ and clears a threshold voltage of the MOSFET 20 is imposed on a gate of the MOSFET 20 to turn on the MOSFET 20.

The through-current control circuit 14 is composed of an input circuit 24 that receives the operation signal Sc and an AND-gate circuit 25 connected to the terminal 11b from which the through-current control signal Sp is fed. The input circuit 24 includes a line L1 connected to the terminal Q1 and a line L2 connected to the terminal Q1 through a inverter 24a. When the operation signal Sc is a high level (H), a first voltage V1 that has a same level as a control voltage, e.g., 5 V is given to the line L1. When Sc is a low level (L), a second voltage V2 that has a level inverted from Sc, e.g., 5 V is given to the line L2.

The AND-gate circuit 25 includes a pair of AND-gates 25a, 25b. One input terminal of both AND-gates 25a, 25b is connected to the terminal 11b, and the other terminal is connected to L1, L2, respectively. When the through-current control signal Sp is H, both the first and second voltages V1, V2 pass through the respective AND-gates 25a, 25b. On the other hand, when Sp is L, both voltages V1, V2 are intercepted by the respective AND-gates 25a, 25b. The first voltage V1 is fed to the gate voltage selecting circuit 15, and the second voltage V2 is fed to the gate of the MOSFET 21 in the output circuit 17.

The gate voltage selecting circuit 15 is composed of a MOSFET 26 having an LDMOS structure, and an AND-gate circuit 27 including a pair of AND-gates 27a, 27b and an inverter 27c connected to the AND gate 27b. A mode selecting signal Sm is fed from a terminal 11a to the gate voltage selecting circuit 15 to select either a test mode or an operation mode. More particularly, the first voltage V1 is fed to one input terminal of both AND-gates 27a, 27b from the AND-gate 25a. The Sm signal is fed to the other input terminal of the AND-gate 27a, and an inverted Sm signal is fed to the other input terminal of the AND-gate 27b through the inverter 27c. When the Sm signal is H, the first voltage V1 passes through the AND-gate 27a and is fed to the gate of the MOSFET 26, thereby turning on the MOSFET 26 and bringing the device operation to a test mode. When the Sm signal is L, the first voltage VI passes through the AND-gate 27b and is fed to the gate of the MOSFET 23 of the gate voltage switching circuit 16, thereby turning on the MOSFET 23 and bringing the device operation to a normal operation mode. Diodes 20a, 21a, 23a and 26a are connected in parallel to the respective MOSFETs 20, 21, 23 and 26 so that reverse current flows through the diodes.

Operation of the voltage supply device having a structure as described above will be explained below. When the through-current control signal Sp is H, the first and second voltages V1, V2 are fed to the device, and the device becomes operative. On the other hand, when the signal Sp is L, the voltages V1, V2 are intercepted, and all the MOSFETs 20, 21, 23, 26 are turned off, and therefore no power is consumed. The following description will be made when the signal Sp is H. ON and OFF states of the MOSFETs 20, 21, 23, 26 are shown in FIG. 3 together with Sp, Sm and Sc signal levels.

Under the operation mode, the power source having a voltage $V_{DDH}$ is connected between the plus terminal 18 and the ground terminal 19 of the device. As shown in FIG. 3, the Sm signal level is L under the operation mode. During a period in which the operation signal Sc is H, the first voltage V1 is given to the line L1 of the input circuit 24. During a period in which the operation signal Sc is L, the second voltage V2 is given to the line L2 of the input circuit 24. When the first voltage V1 is imposed on the gate of the MOSFET 23 through the AND-gate circuits 25, 27, the MOSFET 23 is turned on, and thereby the divider circuit 22 is connected in parallel to the power source. The divided voltage Vd appears at the divider terminal 22b and is imposed on the gate of the MOSFET 20, thereby turning on the MOSFET 20. The output terminal P1 is connected to the power source voltage $V_{DDH}$ through the MOSFET 20. On the other hand, when the second voltage V2 is imposed on the gate of the MOSFET 21 through the AND-gate circuit 25, the MOSFET 21 is turned on, and thereby the output terminal P1 is connected to the ground terminal 19 through the MOSFET 21. Thus, the voltage level of the output terminal P1 is switched between $V_{DDH}$ and the ground level according to the Sc signal level.

Under the test mode where the Sm signal level is H, a test voltage, e.g., 5 V is supplied between the terminals 18 and 19 of the output circuit 17 from a control power source. During a period in which the Sc signal level is H, the first voltage V1 is given to the line L1 of the input circuit 24. The first voltage V1 is imposed on the gate of the MOSFET 26 through the AND-gate circuits 25, 27, turning on the MOSFET 26. The divider terminal 22b is connected to the ground terminal 19 through the MOSFET 26. The gate of the MOSFET 20 is thus connected to the ground terminal through the MOSFET 26, thereby turning on the MOSFET 20. The test voltage, e.g., 5 V appears at the output terminal P1. On the other hand, during a period in which the Sc signal level is L, the second voltage V2 is given to the line L2. The second voltage V2 is imposed on the gate of the MOSFET 21 through the AND-gate circuit 25, thereby turning on the MOSFET 21. The output terminal P1 is connected to the ground terminal 19 through the MOSFET 21. Thus, the P1 voltage is switched between the test voltage, i.e. 5 V and the ground level according to the Sc signal levels. This means that the operation of the MOSFETs 20, 21 can be tested under the low voltage without supplying a high voltage to the output circuit 17.

In short, the operation of the voltage supply device can be easily tested under the test mode that is realized by simply switching the mode selecting signal Sm level to a high level (H). Since the mode selecting signal Sm is commonly fed to all of the plural drivers 13 from the terminal 11a as shown in FIG. 2, the voltage supply device can be easily brought into the test mode. Since a low voltage (e.g., 5 V that is used in the control circuit of the device) is used as a test voltage under the test mode, there is no need to use a high voltage (e.g., 200 V that is a power source voltage in the normal operation).

The present invention is not limited to the embodiment described above, but may be applied to other devices. For example, a voltage supply device for driving plural data electrodes of an electroluminescent display panel may be made according to the present invention, though the foregoing embodiment is described as a device for driving scanning electrodes. Though MOSFETs having an LDMOS structure are used as switching elements in the foregoing embodiment, it is possible to used other semiconductor switching elements such as IGBTs in place of MOSFETs. The dispersed resistances 22a in the divider circuit 22 may be replaced with other resistances such as polysilicon resistances. The level of the voltage at the terminal 19 is not limited to the ground level, but it may be set at other low levels.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A voltage supply device, comprising:
    an output circuit connected to a power source having a high voltage and a low voltage, the output circuit including a first switching transistor and a second switching transistor, both connected in series forming a push-pull circuit the output circuit selectively outputting the high voltage and the low voltage according to operation of the push-pull circuit;
    means for selecting either a test mode in which the voltage supply device is tested under a test voltage that is substantially lower than the high voltage of the power source, or an operation mode in which the voltage supply device normally operates under the high voltage and
    a gate voltage switching circuit, connected to a gate of the first switching transistor and the mold selecting means, for supplying a high gate voltage to turn on the first switching transistor under the operation mode and a low gate voltage to turn on the first switching transistor under the test mode, wherein the gate voltage switching circuit includes:
    a third switching transistor connected to the gate of the first switching transistor, the third switching transistor being turned on to supply the high gate voltage under the operation mode; and a fourth switching transistor connected to the gate of the first switching transistor, the fourth switching transistor being turned on to supply the low gate voltage under the test mode.

2. The voltage supply device as in claim 1, further comprising means for selectively prohibiting the first and second switching transistors from being turned on, according to a signal supplied from outside of the voltage supply device.

3. The voltage supply device as in claim 1, wherein:
    the first switching transistor is a P-channel MOSFET, and the second, third and fourth switching transistors are N-channel MOSFETs.

4. The voltage supply device as in claim 1, including a plurality of driver modules, each of which comprises the output circuit, the selecting means and the gate voltage switching circuit.

5. The voltage supply device as in claim 4, wherein: the plurality of driver modules are all integrated into an integrated circuit.

6. The voltage supply device as in claim 1, wherein:
    the gate voltage switching circuit includes a divider circuit connected in parallel to the output circuit, and the third switching transistor is connected in series to the divider circuit.

7. A method of testing operation of a voltage supply device which includes:
    an output circuit having a first switching transistor and a second switching transistor, both connected in series, the output circuit being connected between a high voltage and a ground voltage of a power source and outputting the high voltage when the first switching transistor is turned on and the ground voltage when the second switching transistor is turned on; and
    a third switching transistor and a fourth switching transistor both connected to a gate of the first switching transistor, the method comprising steps of:
    feeding an external signal to the voltage supply device to bring it to a test mode;
    supplying a test voltage in place of the power source voltage to the output circuit, the test voltage being substantially lower than the power source voltage;
    supplying a test gate voltage to the gate of the first switching transistor by turning on the fourth switching transistor while turning off the third switching transistor, the test gate voltage being substantially lower than a gate voltage under normal operation; and
    selectively turning on the first switching transistor and the second switching transistor to check whether the output circuit selectively outputs the test voltage and the ground voltage.

8. The voltage supply device as in claim 1, wherein:
    the mode selecting means includes an external terminal from which a bi-level mode selecting signal is supplied from outside of the voltage supply device.

* * * * *